(12) United States Patent
Huang et al.

(10) Patent No.: US 6,323,106 B1
(45) Date of Patent: Nov. 27, 2001

(54) DUAL NITROGEN IMPLANTATION TECHNIQUES FOR OXYNITRIDE FORMATION IN SEMICONDUCTOR DEVICES

(75) Inventors: Shih-Fen Huang, Wappingers Falls, NY (US); Helmut Puchner, Santa Clara, CA (US)

(73) Assignee: LSI Logic Corporation, Milpitas, CA (US)

(*) Notice: Subject to any disclaimer, the term of this patent is extended or adjusted under 35 U.S.C. 154(b) by 0 days.

(21) Appl. No.: 09/474,666

(22) Filed: Dec. 29, 1999

Related U.S. Application Data
(60) Provisional application No. 60/152,488, filed on Sep. 2, 1999.

(51) Int. Cl.[7] .................................................. H01L 21/76
(52) U.S. Cl. ........................ 438/433; 438/424; 438/435
(58) Field of Search ........................... 438/296, 424, 438/438, 435, 275, 981

(56) References Cited

U.S. PATENT DOCUMENTS

| | | | |
|---|---|---|---|
| 5,595,922 | * | 1/1997 | Tigelaar et al. .................. 438/981 |
| 5,780,346 | * | 7/1998 | Arghavani et al. .............. 438/296 |
| 5,811,347 | * | 9/1998 | Gardner et al. .................. 438/435 |
| 5,861,347 | * | 1/1999 | Maiti et al. ...................... 438/787 |
| 5,918,116 | * | 6/1999 | Chittipeddi ....................... 438/199 |
| 5,920,779 | * | 7/1999 | Sun et al. ........................ 438/275 |
| 5,943,585 | * | 8/1999 | May et al. ....................... 438/400 |
| 5,960,289 | * | 9/1999 | Tsui et al. ........................ 438/275 |
| 6,033,998 | * | 3/2000 | Aronowitz et al. ............... 438/786 |
| 6,080,682 | * | 6/2000 | Ibok ................................ 438/770 |
| 6,096,664 | * | 1/2000 | Rupp et al. ...................... 438/275 |
| 6,110,780 | * | 8/2000 | Yu et al. ......................... 438/258 |
| 6,118,168 | * | 9/2000 | Moon et al. ..................... 438/435 |
| 6,133,164 | * | 10/2000 | Kim ................................. 438/275 |
| 6,153,480 | * | 11/2000 | Arghavani et al. ............... 438/435 |
| 6,156,620 | * | 12/2000 | Pulchner ......................... 438/400 |
| 6,165,918 | * | 12/2000 | Jia et al. .......................... 438/981 |

* cited by examiner

*Primary Examiner*—Chandra Chaudhari
*Assistant Examiner*—David S Blum

(57) ABSTRACT

Provided is a technique for fabrication of a nitrided gate oxide and shallow trench isolation (STI) oxide liner in a semiconductor depletion into STI oxide and the RNCE in CMOS devices by introducing nitrogen to the STI edges of the p-well. This technique improves isolation performance and is also effective to harden the oxide to reduce boron penetration. Nitridization of the STI liner may be conducted on its own or in combination with gate oxide nitridization, both with beneficial effect with regard to the RNCE. The nitridization may also be focussed on the channel region of the gate oxide in particular in order to mitigate RSCE.

18 Claims, 5 Drawing Sheets

DUAL NITROGEN IMPLANTATION TECHNIQUES FOR OXYNITRIDE FORMATION IN SEMICONDUCTOR DEVICES

CROSS-REFERENCE TO RELATED APPLICATIONS

This application claims priority to U.S. Provisional patent application Ser. No. 60/152,488 entitled ADVANCED NITROGEN PREIMPLANT GATE OXIDE TECHNIQUE FOR SUPPRESSION OF RNWE A RSCE FOR 0.18 μm CMOS TECHNOLOGY filed Sep. 2, 1999, the disclosure of which is incorporated by reference herein for all purposes.

BACKGROUND OF THE INVENTION

The present invention relates to nitrogen implantation schemes for creating oxynitride gates of variable thicknesses and/or an oxynitride liner for shallow trench isolation in semiconductor devices.

Integrated Circuit (IC) technology relies on the successful performance of each of its contributing components. Although the technology drivers are typically high performance active devices, the overall success of an IC technology hinges equally critically on good isolation structures (areas that prevent the active devices from interfering with each other). A variety of techniques have been developed to isolate devices in integrated circuits. Among the different isolation structures, shallow trench isolation (STI) has long been viewed as the indispensable device isolation for deep sub-micron technology, because it is free from bird's beak encroachment, field oxide thinning and leakage due to punchthrough. However, STI is more complicated and costly compared to the conventional LOCOS isolations. Therefore, much like "bird's beak" in LOCOS, these problems limit the scaling of the technology.

Conventional shallow trench isolation involves depositing an oxide layer on the surface of a semiconductor substrate, followed by deposition or formation of a nitride layer that is patterned to act as a mask for shallow trench etch. The nitride mask also has a role as a proper substrate for CMP, and preventing further oxidation of the substrate surface where it is masked. The next step involves etching of the shallow trench followed by formation of an oxide liner in the shallow trench. Following formation of the oxide liner, the trench is filled with deposited oxide, and the partly formed device is subjected to CMP to planerize down to the top of the trench and to the substrate layer adjacent to the trench. Next, the p- and n-wells are implanted using n-well and p-well masks on the corresponding sides. Boron is commonly used as a p-well dopant and phosphorus as an n-well dopant.

During subsequent thermal processing steps, boron tends to diffuse out from the p-well into the substrate, towards the shallow trench and segregate into its oxide. Due to this tendency of boron to diffuse and its diffusion dependence on defects in silicon (referred to as transient enhanced diffusion (TED)), the p-well corner bordering on the shallow trench becomes the weak link in the electrical isolation. The remaining lower concentration of boron is easier to invert than the original higher concentration and tends to allow leakage current to flow at lower threshold voltages than the intended higher boron concentration. Keeping boron concentration up at the p-well/STI interface would help isolation dependability. Better isolation in the p-well corner of the trench would allow for narrower trenches as well. This would save space on chips.

A further problem encountered with shallow trench isolations is the so-called reverse narrow channel effect (RNCE), or reverse narrow width effect (RNWE). This effect refers to the problem encountered at the upper corners of shallow trench isolations that interface with channel regions of transistors adjacent to these STIs. Since threshold voltage varies proportionally with transistor width, rounding of the corners of the STI, which occurs when oxidized liners are used in the STI (the thicker the liner the more the rounding; trench linings typically vary from approximately 100 microns to 400 Å), effectively results in a narrower transistor. This reduces the threshold voltage required to turn the transistor on. Thus, RNCE is the decrease of threshold voltage with decreasing channel width due to rounding of the STI upper corners.

FIG. 1 depicts a graph of threshold voltage ($V_t$) versus channel width (W) illustrating the problem of RNCE. The graph 100 plots three lines. The phantom line 101 represents a flat ideal profile desired by device designers so that control is uniform across the whole width of a transistor. The upper line (curve) 102 represents the voltage threshold profile for a device in which the upper corners of the STI are sharp. The high electric field in these sharp corners collects electrons or holes and therefore more charge at the gate is necessary to invert the channel. Rounding of the corners by applying a STI liner produces the profile of the bottom line (curve) 104. As can be seen in the plot, the threshold voltage decrease for narrow transistors is pronounced. This is the referred to as the RNCE. This RNCE results in difficulties in, for example, design of embedded memory devices.

RNCE is exacerbated by impurity (e.g., boron from the p-well) redistribution at the channel edge caused by the above-noted transient enhanced diffusion (TED). During thermal oxidation, boron migrates into the STI oxide (segregation) and its concentration in silicon is reduced. The corner effect combined with the diffusion of boron in p-wells at the p-well STI interface, combines to have a large effect on threshold voltage in narrow channel widths because the corners on both side of the channel make up a substantial portion of the width of the entire transistor. RNCE frustrates transistor designers' general preference to keep voltage threshold profiles relatively flat over the width of a transistor so that a transistor will work with approximately the same threshold voltage regardless of its width and length.

A related effect is the reversed short channel effect (RSCE). This effect is independent of transistor width and is instead concerned with the transistor length. Where transistor widths are great in a NMOS device (for example in excess of 10 microns), but lengths are short, boron diffusion from the p-well below the lower channel area tends to increase the concentration of boron at the channel surface. This makes the transistor harder to invert requiring a higher threshold voltage to get the same inversion. This phenomenon, referred to as "roll-up," is demonstrated in FIG. 2 which depicts a graph of threshold voltage ($V_t$) versus channel length (L) illustrating the problem of RSCE. FIG. 1 depicts a graph of threshold voltage ($V_A$) versus channel width (W) illustrating the problem of RNCE. The graph 200 plots two lines. The phantom line 201 represents a flat ideal profile desired by device designers so that control is uniform across the whole length of a transistor. The other line (curve) 202 represents the voltage threshold profile for a NMOS device. As can be seen in the plot, short channel transistors as susceptible to roll-up; that is, the voltage threshold increases for short channel transistors. Again, as discussed with RNCE, boron migration from the p-well into the lower channel region towards the gate oxide exacerbates this RSCE roll-up problem.

Accordingly, semiconductor device structures and fabrication techniques that reduce RNCE and RSCE and/or otherwise optimize the use of shallow trench isolation in integrated circuit fabrication would be desirable. cl SUMMARY OF THE INVENTION To achieve the foregoing, the present invention provides a technique for fabrication of a nitrided gate oxide and STI oxide liner in a semiconductor device. One application of the present invention is to suppress both boron penetration into STI oxide and the RNCE in CMOS devices by introducing nitrogen to the STI edges of the p-well. This technique improves isolation performance and is also effective to harden the oxide. Nitridization of the STI liner may be conducted on its own or in combination with gate oxide nitridization, both with beneficial effect with regard to the RNCE. The nitridization may also be focussed on the channel region of the gate oxide in particular in order to mitigate RSCE.

In one aspect, the invention provides a process for forming a shallow trench isolation in a semiconductor device. The process involves depositing a pad oxide layer on the surface of a silicon substrate, forming a shallow trench in the substrate, and forming an oxide liner in the shallow trench. Nitrogen is implanted into the oxide trench liner and underlying substrate silicon at the oxide/silicon interface, and the trench is filled with oxide.

In another aspect, the invention provides a shallow trench isolation in a semiconductor device. The device includes a pad oxide layer on the surface of a silicon substrate and a shallow trench in the substrate separating two or more device regions. The shallow trench includes an oxynitride/silicon nitride liner and is filled with oxide.

In another aspect, the invention provides a method of reducing reverse narrow channel effect in a semiconductor device having a shallow trench isolation separating n-well and p-well regions in a silicon substrate. The method involves implanting nitrogen into a oxide trench liner of the shallow trench isolation and underlying substrate silicon at the oxide/silicon interface, filling the trench with oxide to form a shallow trench isolation, and forming a gate oxide on the substrate and shallow trench isolation. The gate oxide over the n-well region in the substrate is masked, and nitrogen is implanted into an unmasked portion of the gate oxide to form an oxynitride layer overlying a silicon nitride layer. The mask is removed and the oxide and oxynitide portions of the original oxide layer on the substrate and further oxidized.

In another aspect, the invention provides a method of reducing reverse short channel effect in a semiconductor device. The method involves forming source, drain and channel regions in a silicon substrate, and forming an oxide layer on the substrate over the source, drain and channel regions. Nitrogen is implanted into at least a portion of the oxide layer overlying the channel region and underlying substrate silicon at the oxide/silicon interface to form an oxynitride layer overlying a silicon nitride layer, and the oxide and oxynitride portions of the original oxide layer on the substrate are further oxidized.

These and other features and advantages of the present invention are described below with reference to the drawings.

DETAILED DESCRIPTION OF PREFERRED EMBODIMENTS

Figure 1:
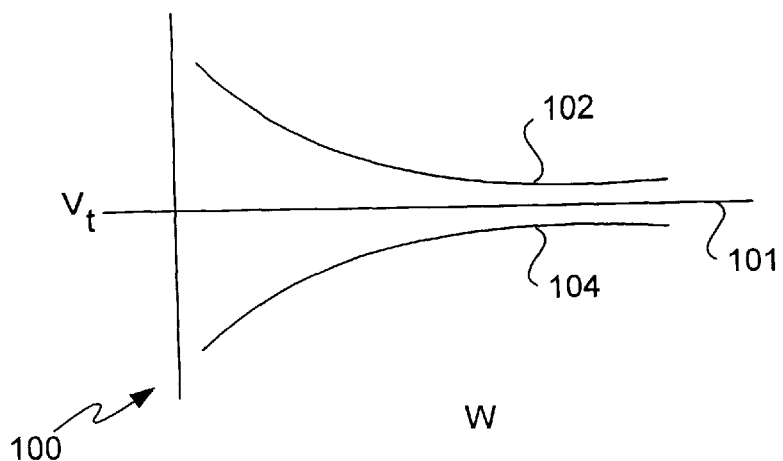
FIG. 1 depicts a graph of threshold voltage ($V_t$) versus channel width (W) illustrating the problem of RNCE.
Figure 2:
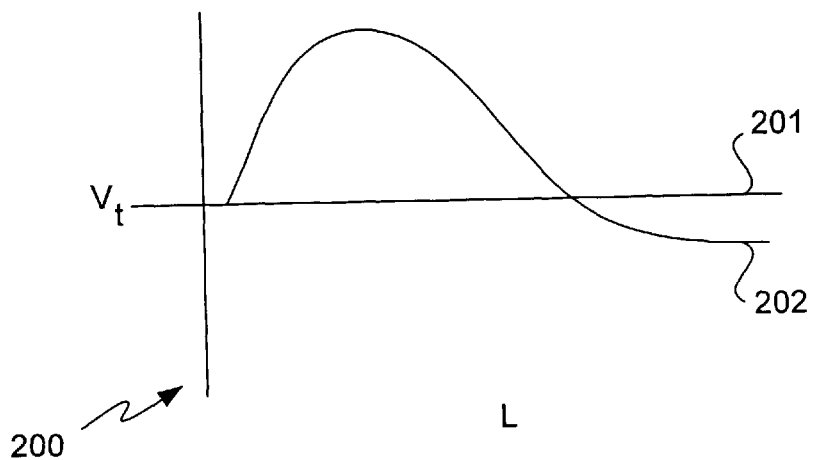
FIG. 2 depicts a graph of threshold voltage ($V_t$) versus channel length (L) illustrating the problem of RSCE.

Reference will now be made in detail to preferred embodiments of the invention. Examples of the preferred embodiments are illustrated in the accompanying drawings. While the invention will be described in conjunction with these preferred embodiments, it will be understood that it is not intended to limit the invention to such preferred embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

The present invention provides a technique for fabrication of a nitrided gate oxide and shallow trench isolation (STI) oxide liner in a semiconductor device. One application of the present invention is to suppress both boron penetration into STI oxide and the RNCE in CMOS devices by introducing nitrogen to the STI edges of the p-well. This technique improves isolation performance and is also effective to harden the oxide. Nitridization of the STI liner may be conducted on its own or in combination with gate oxide nitridization, both with beneficial effect with regard to the RNCE. The nitridization may also be focussed on the channel region of the gate oxide in particular in order to mitigate RSCE.

The nitridization of the trench liner and gate oxide merge to have a collective effect in one preferred embodiment. However, alternative embodiments relate to the mitigation of diffusion of boron towards the trench and towards the channel and have different impacts. Namely, prevention of diffusion of boron into the trench oxide retains the ability of the boron to act as an electrical isolator between the PMOS and NMOS devices of the CMOS; while the diffusion of boron towards the channel effects the threshold voltage at which the device will operate and its profile.

In a particularly preferred embodiment of the present invention, both nitrogen implantation schemes are conducted, thereby significantly improving the device behavior with respect to RNCE and field-punchthrough protection. These nitrogen implants ensure a high nitrogen dopant concentration in the channel region as well as in the STI trench region. Also, they allow the growth of differential gate oxide layers and change the diffusion behavior of the dopants near the Si/SiO$_2$ interfaces. This results in reduction of the RNCE for channel transistors and gives better punch through protection for field transistors due to retarding of the boron depletion in these regions.

While not wishing to be bound by any theory, it is believed that two physical mechanisms are involved in the depletion of boron at the STI-gate oxide corner. These are segregation, and the interface trap assisted recombination of point defects which alters the segregation behavior. The nitrogen present at the Si/SiO$_2$ interface reduces the transport coefficient for the boron which tends to deplete from the boron doped p-well into the adjacent SiO$_2$ isolation layer, thereby reducing boron depletion in the Si p-well region at the interface. In addition, as the nitrogen occupies interface traps the overall recombination rate for point defects at the interface sites it reduced. A lower recombination rate results in less boron transport towards the Si/SiO$_2$ interface thereby retarding the segregation of boron into the oxide. At the bottom of the STI isolation region, the depletion is reduced mainly by the modified segregation behavior, which gives higher field punchthrough protection for n-channel field transistors.

Figures 3A, 3B, 3C, 3D, 3E, 3F:
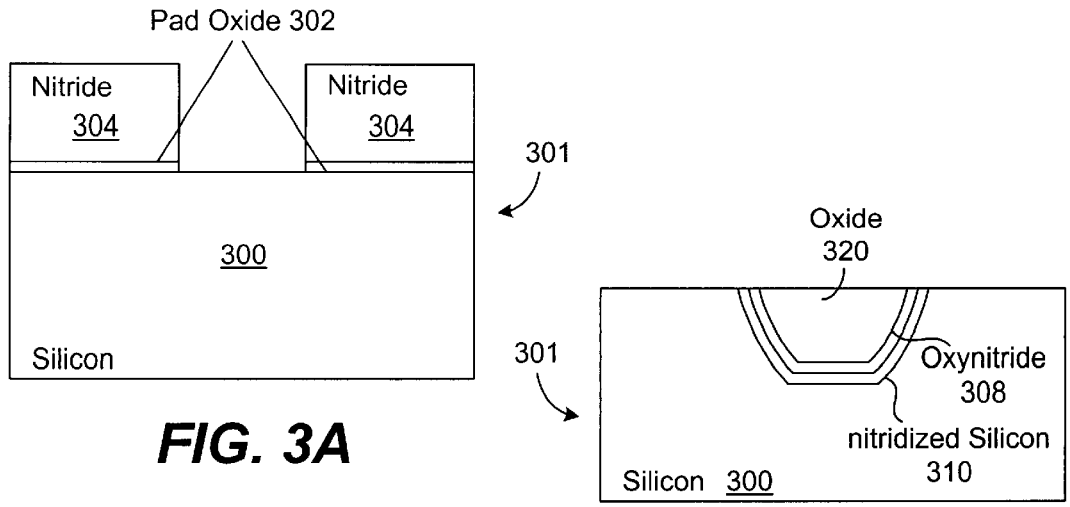
FIGS. 3A–3F depict stages in the fabrication of a semiconductor device having a nitridized shallow trench isolation and gate oxide in accordance with one embodiment of the present invention.

FIGS. 3A–3F depict stages in the fabrication of a semiconductor device having a nitridized shallow trench isolation and gate oxide in accordance with one embodiment of the present invention. The fabrication process begins, as shown in FIG. 3A, with the formation of a thin pad oxide 302 layer on top of a silicon substrate 300 of a wafer 301. The pad oxide 302 may be formed, for example, by thermal processing or in other ways well known to those of skill in the art, and may have a thickness of about 50 to 400 Å.

Formation of the pad oxide 302 is followed by a nitride deposition to form a nitride layer 304. The nitride layer 304 is then patterned to form a hard mask, and a trench 306 is etched into the silicon substrate 300 at the open area of the hard mask 304, as shown in FIG. 3B. The trench may be, for example about 0.05 to 0.5 μm, more preferably 0.2 to 0.4 μm deep. Formation of the trench 306 is followed by a liner oxidation of the trench sidewalls to form an oxide liner 308. The nitride deposition, patterning to form the hard mask, trench etch, and liner oxidation may all be formed according to techniques well known to those of skill in the art. For example, the nitride deposition may be done by using a LPCVD (low pressure chemical vapor deposition) process which results in deposition of about 10,000 to 300 Å, preferably about 1600 Å, of nitride 304 on top of the pad oxide layer 302. The STI trench 306 may be etched by using a high density plasma etch tool based-on HBr, O$_2$, or Cl chemistry. The trench depth may range from about 0.05 to 0.5 μm and be aligned to the electrical Source/Drain junction depth. In a typical embodiment the trench depth may be about 3000 Å. The oxide liner 308 may be grown under oxygen in a vertical furnace. The oxide thickness may vary from about 50 to 500 Å depending on the threshold voltage dependence of the width of the device. In a typical embodiment the liner 308 thickness may be about 300 Å.

The trench liner 308 is then implanted with nitrogen. In one preferred embodiment, shown in FIG. 3C, this nitrogen implant is conducted by a series of tilted nitrogen implants at, for example, a 45 degree tilt angle and rotating twist angle (Nitrogen Implant I). In other embodiments, the nitrogen implant could be conducted as a straight implant or at an angle other than 45 degrees. The projected range of this implant should exceed the oxide liner thickness to achieve sufficient nitrogen dopants near the silicon/oxide linear interface to retard boron (B) diffusion. This implant generates an oxynitride layer 308 and a lightly nitridized silicon layer 310, for example 3 to 4% N at the trench sidewalls.

Then, as shown in FIG. 3D, the trench is filled with oxide 320, for example, according to an HDP-CVD or APCVD oxide process known to those of skill in the art. For example, a HDP-CVD process may be employed to deposit 7500 Å of oxide to completely fill the trench prior to the CMP (chemical mechanical polishing) process. Following oxide deposition, excess oxide and the nitride hard mask 304 are removed down to the substrate 300 level. This removal may be conducted, for example, by a CMP planarization down to the nitride layer which may subsequently be removed by hot phosphoric acid, according to procedures well known in the art.

At this stage, standard processing techniques may be used to complete semiconductor devices, for example, processing to form gate oxide layers and polysilicon gates. The processing described above allows for the STIs between devices on a chip to be made narrower without sacrificing isolation effectiveness.

The presence of the nitrogen in the oxynitride 308 and silicon nitride 310 layers reduces boron diffusion into these areas during subsequent thermal cycles. As a result, the concentration of boron remains relatively high at the p-well STI interface, rather than further diffusing into the STI liner. Preventing boron depletion results in a better isolation in the p-well corner of the trench, which allows for narrower trenches and saves space on integrated circuit chips. Further, because the nitridization takes place in the trench, the amount of nitridization need not be limited by any concerns with respect to subsequent oxidation at the surface for forming gate oxides such as would need to be considered in the case of nitridization at the substrate surface.

In a preferred embodiment, as much of the implanted nitrogen as possible is concentrated in the silicon at the oxygen silicon interface in the trench. The conditions for such a nitrogen implant may be readily determined with little experimentation at the time of implantation. The nitridization dose may be for example 3.5e14 at 25 keV (for a straight implantation). As noted above, the concentration of nitrogen should be high enough to retard boron diffusion. In one embodiment, a 1–10% atomic nitrogen implant may be used for the oxynitride and 1–4% for the silicon nitride.

In another embodiment a tilted multi-step nitrogen implant is used. The maximum tilt angle is determined by the geometric shape of the trench. The angle should be selected so that sufficient nitrogen reaches the bottom of the trench and is not shadowed by the trench sidewalls. The number of rotations (twist angle) during this implant is determined by the layout of the different trenches on the chip and may vary from 4 to 8 to produce symmetric nitrogen profiles at the trench bottom. The implant conditions may be, for example, 4 rotations at 22° tilt and 25 keV 3.5e15 cm$^{-2}$.

While nitridization of the STI sidewalls provides some benefit, the present invention also provides additional advantages achievable through a second nitrogen implant. This second nitidization is conducted in accordance with one preferred embodiment of the present invention to address issues in the channel regions of semiconductor devices.

In additional to STI trench width, another scaling limitation of deep sub-micron devices is gate oxide reliability. The use of oxynitride as a bottom layer in a thin gate oxide structure has been known to improve hot carrier resistance in MOS technology. It also suppresses the diffusion of boron from the polysilicon gate to the channel region. Conventional techniques used to achieve a nitridized thin gate oxide include annealing the polysilicon gate structure in either an ammonia ambient or an oxidizing $N_2O$ ambient. Nitrogen implantation into Si before the gate oxide growth has recently been introduced as a means of reducing the gate oxide growth rate, preventing boron penetration in PMOS, and varying gate oxide thickness and improving thickness uniformity of the gate oxide in some semiconductor devices.

FIGS. 3E and 3F illustrate additional steps that may be taken beyond those illustrated in FIGS. 3A–3D in order to implement a preferred embodiment of the present invention. As shown in FIG. 3E, a layer of screening oxide 322 is formed on the surface of the wafer 301, by thermal oxidation or deposition in accordance with procedures well known in the art. The thickness of this layer may be about 30 to 200 Å, and its main function is to protect the silicon surface during the subsequent implantation step. The wafer 301 is masked at the regions where a thicker gate oxide is desired (in this case, over the n-well region). This masking may be accomplished, for example, by depositing and patterning a photolithographic material to form a mask 330. Nitrogen is then implanted through the screening oxide 322 (in this case, over the p-well region) (Nitrogen Implant II). The screening oxide 322 and photomask 330 are then removed.

As shown in FIG. 3F, this second nitrogen implant extends the oxynitride layer 308 and nitridized silicon layer 310 around the trench 320 out over the p-well region. Gate oxides 340 and 350 with a different thickness may then grown over the n-well and p-well regions of the substrate 300, respectively, according to the nitrogen content on the silicon/gate oxide interface. The depth of the nitridized silicon layer 360 depends on the energy of the nitrogen implant and is determined by the requirements arising from the gate oxide growth retardation at the surface. In one embodiment, a nitrogen implant of $5e14$ $cm^{-2}$ and 35 keV may be used to fabricate a differential gate oxide where the masked gate oxide thickness is about 62 Å and the nitrogen implant exposed gate oxide thickness is about 35 Å.

This second nitrogen implant may also be preformed over the entire surface of the substrate following deposition of the screening gate oxide layer 322. More often, as illustrated in FIGS. 3E and 3F, it may be pre formed on a port ion of the gate oxide on a substrate surface where a photomask is used to prevent nitrogen implantation of another portion of the gate oxide. In this way gate oxides of variable thickness are formed.

This dual implant nitridization is a particularly advantageous feature of one embodiment of the present invention. It is particularly desirable to nitridize the gate oxide overlying a p-well region (i.e. that will subsequently form an NMOS transistor). This is because, as noted above, the nitridization forms both silicon nitride and oxynitride layers as formed in the silicon trench isolation situation. As noted previously, the presence of nitrogen retards boron diffusion and in this case would prevent boron from diffusing to the channel surface area where it would cause RSCE problems. With nitrogen preventing an increase in boron concentration at the channel surface, the voltage threshold is maintained lower. This results in decreased roll-up and a flatter voltage threshold profile which is preferable to transistor designers.

With regard to RNCE/RNWE, the presence of nitrogen at the corner of the STI interface by nitridization in the trench and possibly supplemented by surface nitridization prevents the transistor from turning o n too early. Thus dual implant nitridization in accordance with the present invention allows for more uniform control across the whole width and length of a transistor. This is particularly important in narrow width transistors which are becoming more prevalent as device sizes decrease.

Figure 4:
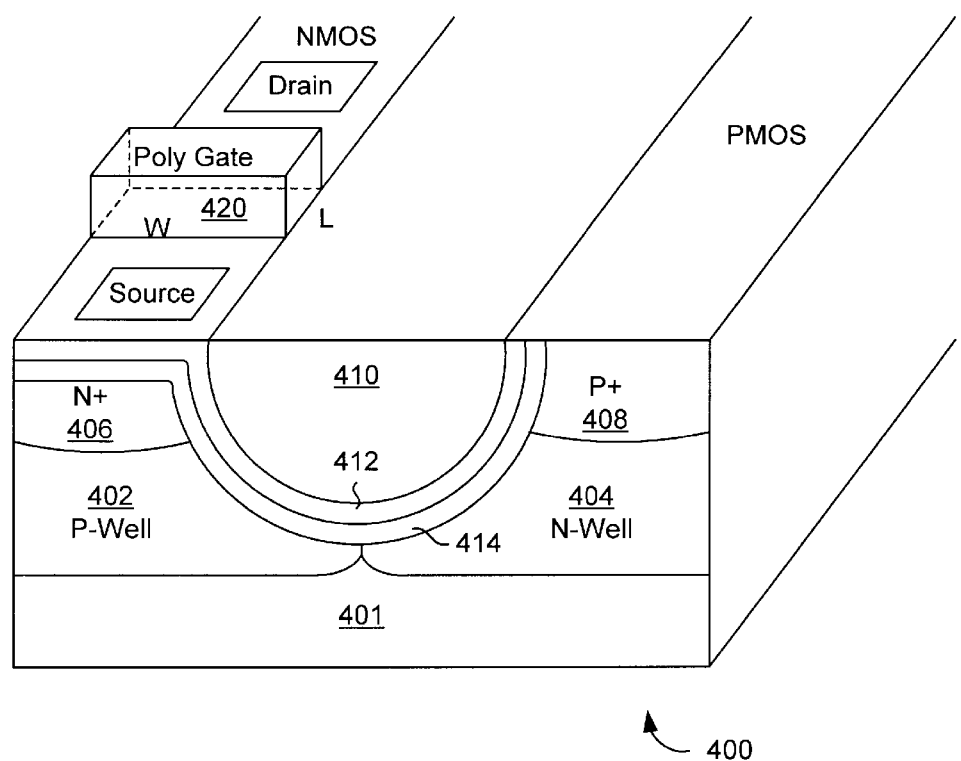
FIG. 4 shows a perspective view (gate width profile) of a CMOS semiconductor device with a shallow trench isolation and surrounding PMOS and NMOS devices illustrating aspects of one embodiment of the present invention.

FIG. 4 shows a perspective view (gate width profile) of a CMOS semiconductor device with a shallow trench isolation and surrounding PMOS and NMOS devices illustrating aspects of one embodiment of the present invention. The CMOS 400 device is composed of a silicon substrate 401 having a p-well 402, doped for example with boron (B) at $3e17$ $cm^{-3}$ peak concentration, and an n-well 404, doped for example with phosphorus (P) at $1e17$ $cm^{-3}$ peak concentration. N+ and p+ source regions for the PMOS and NMOS devices, respectively, that make up the CMOS are separated by a shallow trench isolation (STI) 410. Where the CMOS is formed in accordance with the process described with reference to FIGS. 3A–3F, the STI sidewalls and the substrate surface over the p-well have been implanted with nitrogen to form continuous oxynitride 412 and silicon nitride 414 layers. This provides nitridization along the corner of the channel 420 over its entire length.

This is particularly important in narrow channel width devices, for example devices having channel widths less than about 0.5 μm. As noted above, the rounded corners of the channel 420 (corresponding to the upper corners of the STI) caused by the formation of the STI liner effectively results in a narrower transistor reducing the threshold voltage required to turn the transistor on. Where the channel is already designed to be narrow, the corner effect has a large effect on the transistor's threshold voltage. By nitridizing the channel and STI regions in accordance with the present invention, it is possible to prevent further deterioration of the threshold voltage of a narrow channel transistor by keeping the boron concentration high in the channel and STI regions, preventing the effective width of the channel from decreasing further due to boron depletion.

Figure 5:
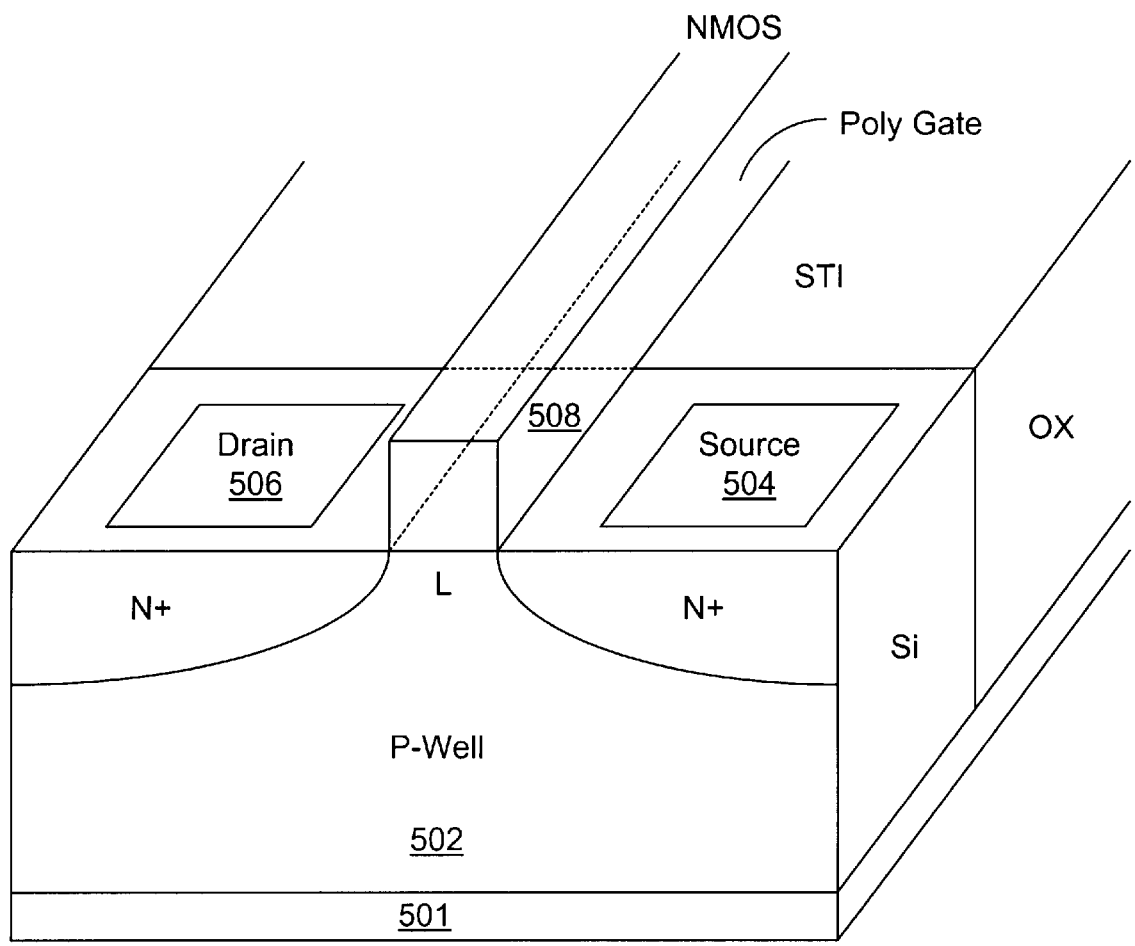
FIG. 5 shows a perspective view (gate length profile) of a CMOS semiconductor device with a shallow trench isolation and surrounding PMOS and NMOS devices illustrating aspects of one embodiment of the present invention.

FIG. 5 shows a perspective view (gate length profile) of a CMOS semiconductor device with a shallow trench isolation and a surrounding PMOS and NMOS devices illustrating aspects of the present invention. For non-narrow transistors (e.g., width greater than 10 microns), RNCE is not a problem. However, for short channel (e.g., length less than about 1 micron) transistors RSCE may be, and roll-up should be avoided. The CMOS 500 device is composed of a silicon substrate 501 having a p-well 502, doped for example with boron (B) at $3e17$ $cm^{-3}$ peak concentration. The NMOS transistor device of the CMOS 500 is composed of a source 504 and a drain 506 separated by a channel 508. The NMOS and PMOS (not shown) devices that make up the CMOS 500 are separated by a shallow trench isolation (STI) 510.

Where the CMOS is formed in accordance with the process described with reference to FIGS. 3A–3F, the STI sidewalls and the substrate surface over the p-well have been implanted with nitrogen to form continuous oxynitride 512 and silicon nitride 514 layers. This provides nitridization at the channel surface that prevents the diffusion of boron to the channel surface towards the conventional gate oxide, and thereby prevents the threshold voltage for the NMOS device of the CMOS 500 from getting any higher. The nitridization of the gate oxide retards the diffusion of boron from the polysilicon gate electrode towards the gate oxide into the channel region of the PMOS device, and thereby prevents the threshold voltage of the PMOS device from getting lowered ("boron penetration").

EXAMPLE

The following example provides details concerning techniques and structures which demonstrate an implementation in accordance with the present invention. It should be understood the following is representative only, and that the invention is not limited by the detail set forth in this example.

Shallow trenches (0.253 µm and 0.4 µm deep) were etched into a silicon substrate using a nitride/oxide hard mask, and followed by a short high temperature liner oxidation. The trench was filled with a HDP-CVD, and followed by a CMP planarization down to the nitride layer, which was subsequently removed by hot phosphoric acid. Retrograde wells were done afterwards. A nitrogen-rich layer was introduced to the Si/SiO$_2$ interface at trench edge by implanting nitrogen at 25 keV with a dose of 4e14 and 5e14 cm$^{-2}$ through a screen oxide. Gate oxide growth followed. Then a polysilicon layer was deposited and doped. Standard back-end process was carried out to metal one.

Figure 6:
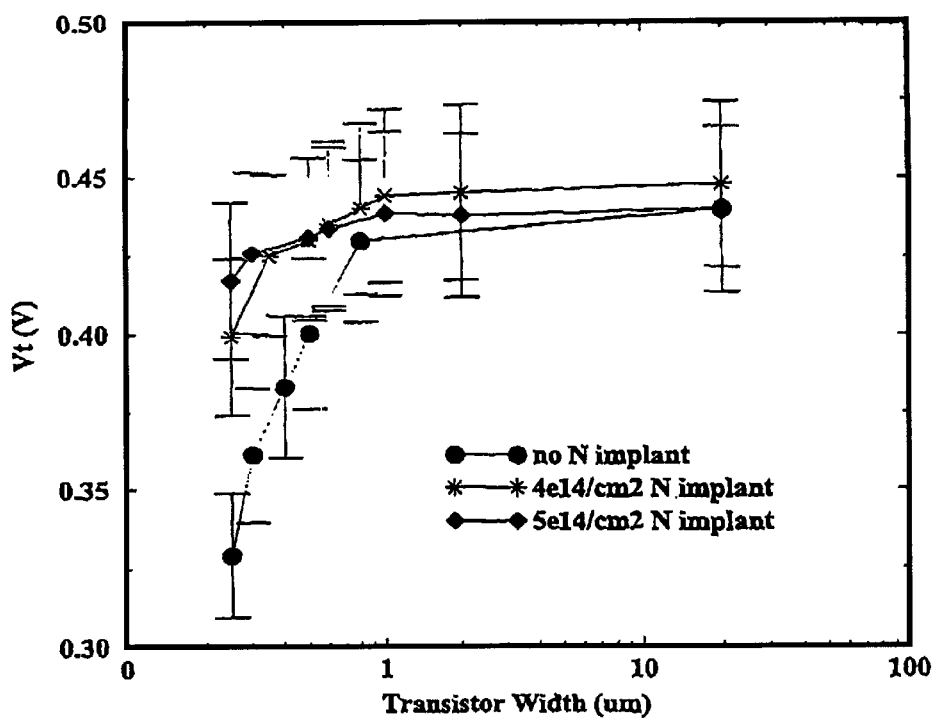
FIG. 6 shows a plot for threshold voltage ($V_t$) vs. transistor width for NMOS devices with different nitrogen implant doses prior to gate oxide growth in accordance with one example of an implementation of the present invention.
Figure 7:
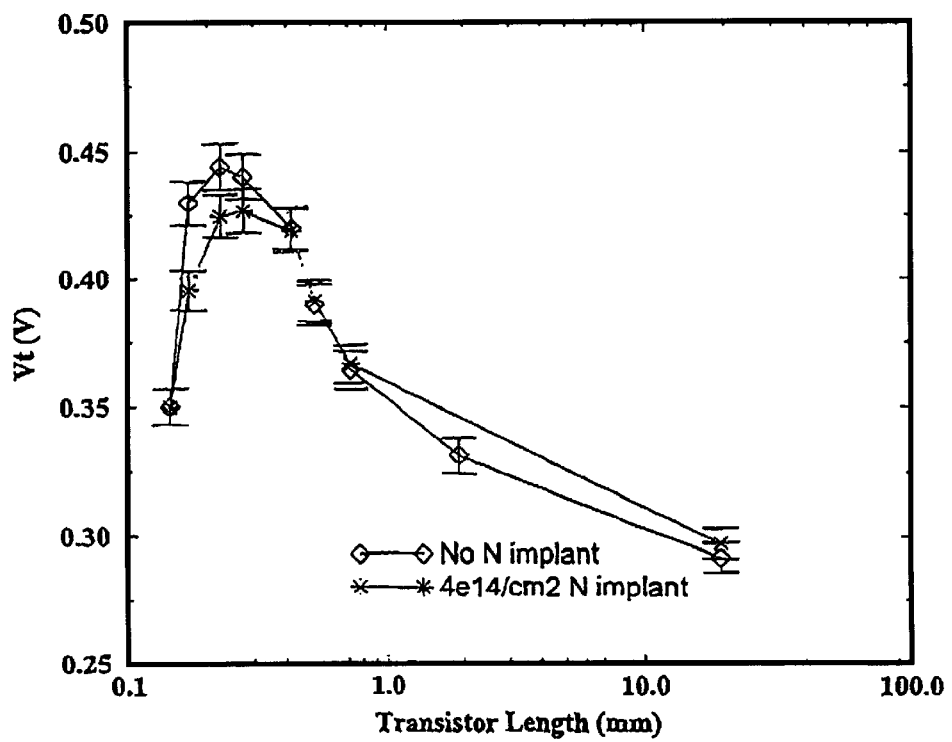
FIG. 7 shows a plot of threshold voltage ($V_t$) vs. transistor length for NMOS devices with different nitrogen implant doses prior to the gate oxide growth in accordance with one example of an implementation of the present invention.

The experimental data show a RNCE-free device and a suppressed RSCE as well for NMOS devices, as shown in FIGS. 6 and 7. The nitrogen implant had no observed impact in PMOS devices. It is postulated that for RNCE, the nitrogen-rich layer reduces the interstitial recombination ate at the Si/SiO$_2$ interface, therefore stops the flux of the interstitial atoms, thus resulting in the suppression of boron diffusion caused by TED. FIG. 6 shows a plot for threshold voltage (V$_t$) vs. transistor width for NMOS devices with different nitrogen implant doses prior to gate oxide growth (channel length, L=0.18 µm; oxide thickness, t$_{ox}$=35 Å). The V$_t$ differences between W=0.25 µm and 20 µm devices drop from 100 mV to 20 mV when nitrogen implant doses increase from 0 to 5e14/cm$^2$.

In addition, this layer acts as a diffusion barrier and thus reduces the depletion of boron dopant into field oxide. For the RSCE, the reduction of interstitial recombination rate at Si/SiO$_2$ interface along channel region is believed to suppress TED enhanced boron pile-up. FIG. 7 shows a plot of threshold voltage (V$_t$) vs. transistor length for NMOS devices with different nitrogen implant doses prior to the gate oxide growth. (channel width, W=20 µm; oxide thickness, t$_{ox}$=35 Å). The reverse short channel effects (considering the 0.03 µm channel length shows the largest amount of RSCE, RSCE is defined as the V$_t$ difference between 20 µm and 0.3 µm channel length devices) drop from 153 mV to 120 mV when nitrogen implant doses increase from 0 to 4e14/cm$^2$.

In summary, nitrogen implant prior to gate oxide growth can suppress the reverse narrow channel effect (RNCE) and reverse short channel effect (RSCE) caused by transient enhanced diffusion (TED). A RNCE-free device with suppressed RSCE can be achieved by using nitrogen implant prior to the gate oxide growth.

Conclusion

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A process for forming a shallow trench isolation in a semiconductor device, comprising:
   depositing a pad oxide layer on the surface of a silicon substrate;
   forming a shallow trench in the substrate;
   forming an oxide liner in the shallow trench;
   implanting nitrogen into the oxide trench liner and underlying substrate silicon at the oxide/silicon interface; and
   filling the trench with oxide.

2. The process of claim 1, further comprising forming and patterning a nitride mask layer on the pad oxide layer prior to forming the shallow trench.

3. The process of claim 1, further comprising removing the mask and planarizing the semiconductor device down to the substrate.

4. The process of claim 3, further comprising forming a gate oxide on the substrate and shallow trench isolation.

5. The process of claim 4, further comprising:
   masking the gate oxide in a region where a thicker gate oxide is desired;
   implanting nitrogen into an unmasked portion of said gate oxide to form an oxynitride layer overlying a silicon nitride layer;
   removing the mask; and
   further oxidizing the oxide and oxynitide portions of the original oxide layer on the substrate.

6. The process of claim 5, wherein the gate oxide is grown by thermal oxidation.

7. The process of claim 5, wherein said masking is conducted over an n-well region in said substrate.

8. The process of claim 7, wherein an unmasked p-well region of said substrate is nitridized such that nitrogen is implanted into the gate oxide and underlying substrate silicon at the oxide/silicon interface in that region.

9. The process of claim 1, wherein said trench is formed about 0.05 to 0.5 µm micron deep by etching.

10. The process of claim 1, wherein the nitrogen implant is conducted using a series of tilted nitrogen implants.

11. The process of claim 10, wherein the series of tilted nitrogen implants is conducted at about a 22° tilt angle and rotating twist angle.

12. The process of claim 10, wherein the series of tilted nitrogen implants is conducted at about a 90° angle to the substrate.

13. The process of claim 10, wherein the series of tilted nitrogen implants is conducted such that about 1 to 10% of nitrogen is implanted in said oxide trench liner.

14. The process of claim 1, wherein the trench is filled by a chemical vapor deposition technique selected from HDP-CVD and APCVD.

15. The process of claim 1 wherein said nitrogen implant is conducted with N$^+$ or N$^2$ species using 10–100 keV energy and 1e14 cm-2 to 5e15 cm-2 implantation dose.

16. A method of reducing reverse narrow channel effect in a semiconductor device having a shallow trench isolation separating n-well and p-well regions in a silicon substrate, comprising:
   implanting nitrogen into a oxide trench liner of the shallow trench isolation and underlying substrate silicon at the oxide/silicon interface;
   filling the trench with oxide to form a shallow trench isolation;
   forming a gate oxide on the substrate and shallow trench isolation;
   masking the gate oxide over the n-well region in said substrate;
   implanting nitrogen into an unmasked portion of said gate oxide to form an oxynitride layer overlying a silicon nitride layer;
   removing the mask; and
   further oxidizing the oxide and oxynitide portions of the original oxide layer on the substrate.

17. The method of claim 16, wherein said semiconductor device comprises a narrow channel.

18. The method of claim 17, wherein said narrow channel is less than about 0.5 micron wide.

* * * * *